United States Patent
Wan et al.

(10) Patent No.: US 8,935,584 B2
(45) Date of Patent: Jan. 13, 2015

(54) SYSTEM AND METHOD FOR PERFORMING SCAN TEST

(71) Applicants: Guoping Wan, Suzhou (CN); Shayan Zhang, Suzhou (CN); Wanggen Zhang, Suzhou (CN)

(72) Inventors: Guoping Wan, Suzhou (CN); Shayan Zhang, Suzhou (CN); Wanggen Zhang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 142 days.

(21) Appl. No.: 13/681,406

(22) Filed: Nov. 19, 2012

(65) Prior Publication Data
US 2014/0032986 A1 Jan. 30, 2014

(30) Foreign Application Priority Data
Jul. 27, 2012 (CN) .......................... 2012 1 0352772

(51) Int. Cl.
*G01R 31/3177* (2006.01)
*G01R 31/3185* (2006.01)
*G11C 29/32* (2006.01)
*G01R 31/3187* (2006.01)

(52) U.S. Cl.
CPC ........ *G01R 31/318536* (2013.01); *G11C 29/32* (2013.01); *G01R 31/3187* (2013.01); *G01R 31/318558* (2013.01)
USPC .......................................... 714/726; 714/718

(58) Field of Classification Search
CPC ................. G01R 31/318544; G01R 31/31855; G01R 31/318533; G01R 31/318536; G01R 31/318552; G01R 31/318555; G01R 31/318558; G01R 31/318561; G01R 31/318563; G01R 31/318583; G01R 31/318586; G01R 31/3187; G11C 29/32; G11C 29/40
USPC ......... 714/726, 729, 731, 733, 734, 727, 724, 714/725, 718
See application file for complete search history.

(56) References Cited

U.S. PATENT DOCUMENTS

| | | | |
|---|---|---|---|
| 5,150,044 A | 9/1992 | Hashizume | |
| 5,448,575 A | 9/1995 | Hashizume | |
| 5,615,217 A | 3/1997 | Horne | |
| 6,587,981 B1 | 7/2003 | Muradali | |
| 7,246,282 B2 | 7/2007 | Chau | |
| 7,519,883 B1 | 4/2009 | Daugherty | |
| 7,650,548 B2 | 1/2010 | Block | |
| 7,657,854 B2 | 2/2010 | Goel | |
| 7,761,755 B1 * | 7/2010 | Payakapan et al. | 714/724 |
| 2002/0075740 A1 * | 6/2002 | Sung et al. | 365/201 |
| 2008/0127021 A1 * | 5/2008 | Goel et al. | 716/10 |
| 2010/0332177 A1 * | 12/2010 | Wu et al. | 702/117 |
| 2012/0072797 A1 * | 3/2012 | Devta-Prasanna | 714/731 |

* cited by examiner

*Primary Examiner* — Albert Decady
*Assistant Examiner* — Christian Dorman
(74) *Attorney, Agent, or Firm* — Charles Bergere

(57) ABSTRACT

A system for performing a scan test on an integrated circuit such as a System on a Chip (SoC) that may be packaged in different package types and with different features enabled includes a bypass-signal generator and a first scan-bypass circuit. The bypass-signal generator generates a first bypass signal based on chip package information. The first bypass signal indicates whether a first scan chain associated with a first non-common circuit block of the SoC is to be bypassed. The first scan chain is bypassed in response to the first bypass signal. By enabling partial scan testing based on package information, unintentional yield loss caused by a full scan test determining an SoC is faulty can be avoided.

17 Claims, 5 Drawing Sheets

40

| LUT OUTPUT / PACKAGE INFO | BYPASS SIGNAL A-A | BYPASS SIGNAL B-B | BYPASS SIGNAL C-C | ... | BYPASS SIGNAL N-N |
|---|---|---|---|---|---|
| 0000 | 0 | 0 | 0 | . | 0 |
| 0001 | 0 | 0 | 1 | . | 0 |
| 0010 | 1 | 1 | 0 | . | 0 |
| 0011 | 0 | 0 | 1 | . | 1 |
| 0100 | 0 | 1 | 1 | . | 0 |
| ... | . | . | . | . | . |
| 1111 | 1 | 1 | 1 | . | 1 |

FIG. 4

SYSTEM AND METHOD FOR PERFORMING SCAN TEST

BACKGROUND OF THE INVENTION

The present invention relates generally to scan testing and memory built-in self test (BIST) of integrated circuits and, more particularly, to a system and method for performing a scan test and a memory BIST test on integrated circuits using a scan bypass and a BIST bypass.

In recent years there have been tremendous advancements in the fields of semiconductor devices and electronic circuit integration. Currently, a single system-on-chip (SoC) with multiple package types or options is available. In small package embodiments, certain functional intellectual property (IP) blocks may be masked out depending on the selected package type. The masked out IP blocks may include combinational logic blocks and memory blocks.

FIG. 1 is a schematic diagram illustrating scan testing using scan chain design and memory testing using BIST controllers in system that includes both scan and BIST test systems. That is, scan testing is performed on an integrated circuit (IC) 10 having a plurality of scan chains 12 using an automatic test equipment 14 (ATE), which employs a deterministic automatic test pattern generation (ATPG). The IC 10 also may have a plurality of BIST controllers 15 for testing memory modules (not shown) using the ATE 14. The ATE 14 inputs compressed scan test patterns to the IC 10. The IC 10 includes a decompressor 16 that receives and decompresses the scan test patterns and provides the decompressed test patterns to the scan chains 0-N 12 such that all of the flip-flops of the IC 10, including those of unused functional circuit blocks, are tested for faults. The scan test response from the scan chains 12 are output to a compressor 18, which compresses the scan test response and then provides the compressed scan test response to the ATE 14 where it is compared with expected scan responses to determine whether the IC 10 has any faults. Similarly, memory test patterns are generated and provided to the BIST controllers 0-M 15 for testing memory blocks of the IC 10.

If any faults exist and are detected in the masked-out blocks, the IC 10 will be discarded. However, the IC 10 may still be operable for other package types in which the masked-out blocks are not necessary for functional operation. Thus, the full scan and full memory BIST tests may result in unintentional yield loss. It would be advantageous to be able to prevent unintentional yield loss due to faults only in the masked-out blocks.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying Figures, in which like references indicate similar elements.

FIG. 4 is a truth table illustrating a logical decoding states to determine values of bypass signals in response to chip package information according to an embodiment of the present invention.

DETAILED DESCRIPTION OF THE INVENTION

Figure 1:
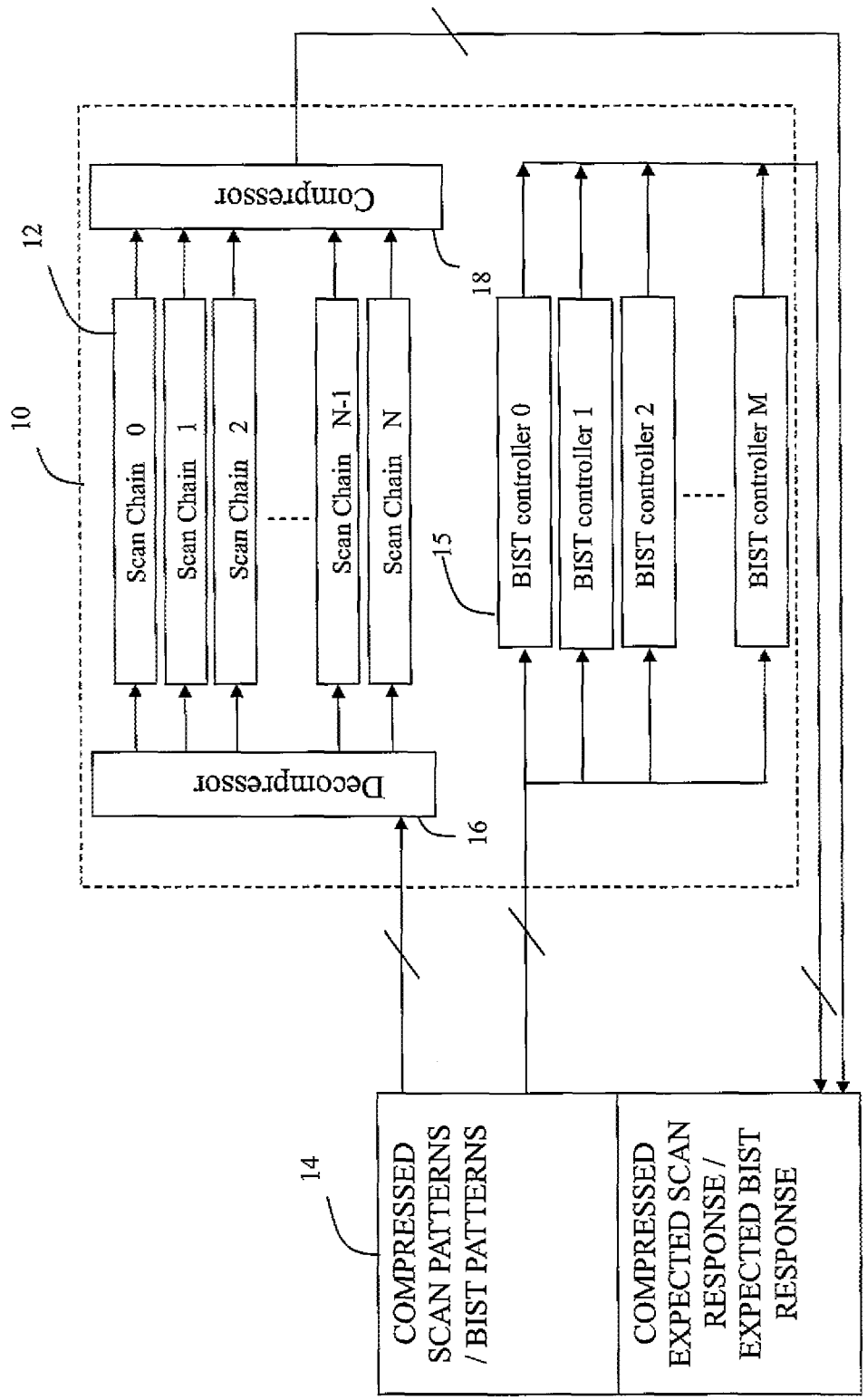
FIG. 1 is a schematic block diagram illustrating conventional scan testing of an integrated circuit using scan chains and memory testing using BIST controllers.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a system for performing a scan test that includes a bypass-signal generator and a first scan bypass circuit. The bypass-signal generator generates a first bypass signal based on chip package information. The first bypass signal indicates whether a first scan chain associated with a first non-common IP block of the chip is to be bypassed during the scan test. The first scan bypass circuit bypasses the first scan chain in response to the first bypass signal.

In another embodiment, the present invention provides a system for performing a memory BIST test that includes a bypass-signal generator and a first BIST bypass circuit. The bypass-signal generator generates a first bypass signal based on chip package information. The first bypass signal indicates whether a first BIST controller associated with a first non-common memory block of the chip is to be bypassed during the memory BIST test. The first BIST bypass circuit bypasses the first BIST controller in response to the first bypass signal.

In an embodiment of the present invention, the system also includes a first scan-clock gating circuit that gates a scan clock for the first scan chain in response to the first bypass signal. In another embodiment of the present invention, the system further includes a first BIST-clock gating circuit that gates a BIST clock for the first BIST controller in response to the first bypass signal.

In another embodiment, the present invention provides a method for performing a scan test that includes generating a first bypass signal based on chip package information. The first bypass signal indicates whether a first scan chain associated with a first non-common IP block of the chip is to be bypassed, and bypassing the first scan chain in response to the first bypass signal.

In another embodiment, the present invention provides a method for performing a BIST test that includes generating a first bypass signal based on chip package information. The first bypass signal indicates whether a first BIST controller associated with a first non-common memory block of the chip is to be bypassed, and bypassing the first BIST controller in response to the first bypass signal.

In an embodiment of the present invention, the method includes gating a scan clock for the first scan chain in response to the first bypass signal. In another embodiment of the present invention, the method includes gating a BIST clock for the first BIST controller in response to the first bypass signal.

The present invention is advantageous in reducing yield loss unintentionally occurred in testing of circuit IPs and memory modules that are not to be used in a particular chip package configuration and also in reducing power consumption during testing.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiments disclosed may be readily used as a basis for modifying or designing other structures or processes for carrying out the same purposes of the present invention. It should also be realized by those skilled in the art that such equivalent constructions do not depart from the spirit and scope of the invention as set forth in the appended claims.

Present electronic technology allows an integrated circuit (IC) such as a SoC to be packaged in any of a variety of package options. The package options may be a multi-chip package or a single-chip package. According to the present invention, the IC or SoC is package-aware and programmable. It should be noted that the terms SoC, chip, die, and IC are used interchangeably in the specification. The terminology used in the specification is only used for clearly illustrating and describing the embodiments of the present invention, but not for limiting the essence of the present invention.

An integrated circuit such as a SoC that may be packaged in various packages, for example 116 pin BGA vs. 144 pin BGA, includes common IP blocks and non-common IP blocks. The common IP blocks are those that are used by the SoC even though assembled in different packages, while the non-common IP blocks are those only used in one or more certain ones of the package types. An IP block may be a functional circuit block, a memory block, or a combination of a functional circuit block and memory block. When performing a scan test on the SoC of a selected package type, if all the scan chains, including those of any unused functional circuit blocks, are scanned, scanning the unused functional circuit blocks causes unnecessary power consumption and takes additional time. Similarly, when performing a BIST test on a SoC of a selected package type, if all the BIST controllers are tested, testing the unused memory blocks causes unnecessary power and time consumption. More importantly, if defects are found only in the unused IP blocks, the SoC may still be operable for some package types. For example, for a chip supporting four (4) package options, such as a 121-pin BGA, 144-pin BGA, 196-pin BGA, and 256-pin BGA, the Test and Debug block, i.e., JTAG, is a common IP block, while the double data rate-synchronous dynamic random access memory (DDR-SDRAM), liquid crystal display controller (LCDC), NAND flash controller (NFC), floating point processing unit (FPU), USB2OTG, etc., are non-common IP blocks.

If the chip is to be assembled into a 144-pin BGA package the non-common IP blocks DDR, LCDC, NFC and USB2OTG may be non-functional blocks and these non-functional blocks can use up about 25% of the total sea of gate (SOG) count of the chip. Thus, if time, cost and effort to discover defects in these blocks during the scan test are saved, approximately 25% of the scan test yield may be improved. Therefore, performing a full scan test and a full memory BIST test on a SoC with multiple package options may introduce an unintentional yield loss.

Embodiments of the present invention solve the above technical problem. The present invention uses chip package information stored in a register on the chip to automatically bypass scan chains for functional circuit blocks and memory BIST controllers for memory blocks that will non-functional or non-operational for that certain package, and thus yield recovery is possible. Further, as described in more detail below, in one embodiment, the present invention uses the chip package information to automatically gate the scan clocks and BIST clocks to those unused IP blocks to decrease the power dissipation during scan test and memory BIST.

One embodiment of the present invention provides a system for performing a scan test. The system comprises a bypass-signal generator and a first scan bypass circuit. The bypass-signal generator generates a first bypass signal based on chip package information, the first bypass signal indicating whether a first scan chain associated with a first non-common IP block of the chip is to be bypassed. The first scan bypass circuit bypasses the first scan chain in response to the first bypass signal. In an embodiment of the present invention, the system further comprises a second scan bypass circuit. The bypass-signal generator further generates a second bypass signal based on the package information, the second bypass signal indicating whether a second scan chain associated with a second non-common IP block is to be bypassed. The second scan bypass circuit bypasses the second scan chain in response to the second bypass signal.

According to one embodiment of the present invention, the system for performing a scan test further has a first scan-clock gate circuit gating a scan clock for the first scan chain in response to the first bypass signal. According to another embodiment of the present invention, the system further comprises a second scan-clock gate circuit gating a scan clock for the second scan chain in response to the second bypass signal.

In an embodiment of the present invention, the bypass-signal generator includes a lookup table of the chip receiving the package information. In another embodiment of the present invention, the first scan bypass circuit includes a first 2-to-1 multiplexer and the second scan bypass circuit includes a second 2-to-1 multiplexer. The first bypass signal and second bypass signal are provided to the first 2-to-1 multiplexer and second 2-to-1 multiplexer as a selection signal respectively. In a further embodiment of the present invention, the system further includes an input receiving an enable signal to allow the system to perform the scan bypass test.

In addition, one embodiment of the present invention provides a method for performing a scan test, which comprises generating a first bypass signal based on package information of the chip, the first bypass signal indicating whether a first scan chain associated with a first non-common IP block of the chip is to be bypassed, and bypassing the first scan chain in response to the first bypass signal. In one embodiment of the present invention, the method further comprises generating a second bypass signal based on the package information, the second bypass signal indicating whether a second scan chain associated with a second non-common IP block of the chip is to be bypassed, and bypassing the second scan chain in response to the second bypass signal According to an embodiment of the present invention, the method for performing a scan test further includes gating a scan clock for the first scan chain in response to the first bypass signal. In another embodiment of the present invention, the method further comprises gating a scan clock for the second scan chain in response to the second bypass signal.

In an embodiment of the present invention, the first and second bypass signals are generated by a lookup table of the chip. Bypassing the first scan chain is performed by a first 2-to-1 multiplexer and bypassing the second scan chain is performed by a second 2-to-1 multiplexer. The first bypass signal and second bypass signal are provided to the first 2-to-1 multiplexer and second 2-to-1 multiplexer as a selection signal respectively. In another embodiment of the present invention, the method further comprises receiving an enable signal to perform the scan bypass test.

In another embodiment, the present invention provides a system for performing a memory BIST test that includes a bypass-signal generator and a first BIST bypass circuit. The bypass-signal generator generates a first bypass signal based on chip package information. The first bypass signal indicates whether a first BIST controller associated with a first non-common memory block of the chip is to be bypassed during BIST test. The first BIST bypass circuit bypasses the first BIST controller in response to the first bypass signal. In an embodiment of the present invention, the system further comprises a second BIST bypass circuit. The bypass-signal generator further generates a second bypass signal based on the package information, the second bypass signal indicating whether a second BIST controller associated with a second non-common memory block is to be bypassed. The second BIST bypass circuit bypasses the second BIST controller in response to the second bypass signal.

According to one embodiment of the present invention, the system for performing a BIST test further has a first BIST-clock gate circuit gating a BIST clock for the first BIST controller in response to the first bypass signal. According to another embodiment of the present invention, the system further comprises a second BIST-clock gate circuit gating a BIST clock for the second BIST controller in response to the second bypass signal.

Figure 2:
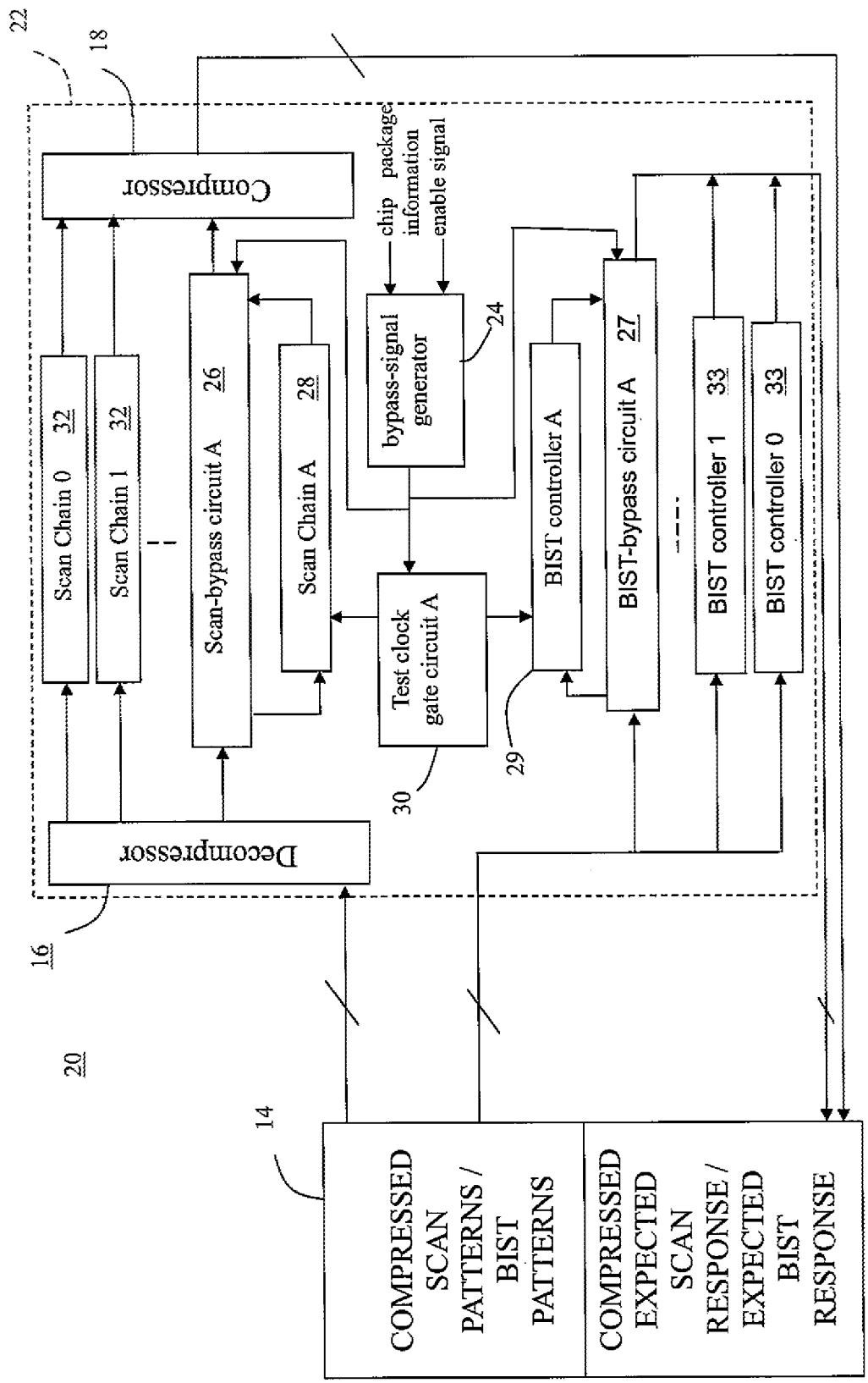
FIG. 2 is a schematic block diagram illustrating an integrated circuit including a system for performing a scan test and a memory BIST test in accordance with an embodiment of the present invention.

Referring now to FIG. 2, a schematic block diagram illustrating a system 20 for performing scan test and memory BIST on an IC or SoC 22 in accordance with an embodiment of the present invention is shown. The system 20 includes an ATE 14 that generates and transmits test patterns to the IC 22, and receives test responses from the IC 22, as is known in the art. The IC 22 may include a decompressor 16 for decompressing compressed scan data in and a compressor 18 for compressing scan test data prior to transmitting the scan test data to the ATE 14.

According to the present invention, the IC 22 also includes a bypass-signal generator 24, a plurality of scan-bypass circuits 26 (only one is shown), a plurality of BIST-bypass circuits 27 (only one is shown), a plurality of scan chains 28, a plurality of BIST controllers 29 (only the one associated with the BIST-bypass circuit 27 is shown), a plurality of test clock gating circuits 30 (only one associated with scan chain A and BIST controller A is shown), additional scan chains 32, and additional BIST controllers 33.

For the scan testing, the scan data from the ATE 14 preferably comprises compressed scan data, as is known in the art, which is received by the decompressor 16. For the BIST, however, the BIST data from the ATE 14 depends less on compression/decompression and so can be directly fed to and received from the BIST controller 29 and additional BIST controllers 33. The compressed scan data then is decompressed and input to the scan chains 32 of the various functional circuit blocks (i.e., the common and non-common functional circuit blocks for a selected package type) to check for faults, as is known in the art. For example, in this embodiment of the present invention, the additional scan chains 32 and additional BIST controllers 33 are associated with common IP blocks, while the scan chain A 28 and BIST controller A 29 are associated with a non-common IP block A (i.e., functional circuit block A and memory A). Thereafter, corresponding scan-out patterns are received by the compressor 18, which compresses the scan out patterns and provides the compressed response to the ATE 14 where the compressed data is compared with expected scan responses to determine whether the IC 22 has any faults. On the other hand, the BIST output data may be compared directly with expected responses by the ATE 14 without going through compression and decompression processes.

However, regarding the scan chains associated with the non-common functional circuit blocks, such as the scan chain A 28, a decompressed scan test pattern is provided to the scan-bypass circuit 26 based on a first bypass signal generated by the bypass-signal generator 24. Similarly, the BIST controllers associated with the non-common memory blocks, such as the BIST controller A 29, receive a test pattern from the ATE 14 and provide the test pattern to the BIST-bypass circuit 27 based on a second bypass signal generated by the bypass-signal generator 24. The bypass-signal generator 24 generates a plurality of bypass signals for the non-common IP blocks based on chip package information stored in the IC 22, if the IC 22 permits scan-bypass and BIST-bypass, which can programmed into the IC 22. As an alternative to storing the chip package information in a register in the IC 22, the chip package information could be transmitted to the bypass-signal generator 24 from outside of the IC 22. Preferably the bypass-signal generator 24 also receives an enable signal from an input pin of the IC 22 to enable generation of bypass signals.

Each bypass signal indicates whether a scan chain and/or BIST controller associated with a non-common IP block is to be bypassed. For a certain selected package type of the IC 22, if a non-common IP block is not used, the associated bypass signal indicates that the non-common IP block is to be bypassed (not tested); otherwise, the associated bypass signal indicates that the non-common IP block is not to be bypassed, and therefore, the non-common IP block undergoes scan test and/or BIST.

In a scan bypass test, the plurality of scan-bypass circuits 26 bypass the associated scan chains in response to the bypass signals generated by the bypass-signal generator 24. For example, for the scan chain A 28, if the first bypass signal indicates that the non-common functional circuit block A is to be bypassed, the scan-bypass circuit 26 bypasses the scan chain A 28 so that the response of scan chain A will not be compared. Thus any defect in non-common functional circuit block A that could be detected by scan testing will be ignored; otherwise, the scan-bypass circuit 26 does not cause the scan chain A 28 bypassed. Alternatively, the scan-bypass circuit A 26 can simply pass the uncompressed scan data back to the compressor 18 without rippling the scan data through any of the latches so that there will not be a miscompare indicating a fault.

Similarly, in a memory BIST test, if a non-common memory block is to be bypassed (not tested because it is non-functional), the bypass signal generator 24 generates the second bypass enable signal and provides it to the BIST bypass circuit A 27. Once enabled, the BIST bypass circuit A 27 bypasses the associated BIST controllers such that such BIST data is not used to test that memory block so there will not later be a miscompare and therefore, the unused memory block will not be determined as faulty. For example, for the BIST controller A 29, if the second bypass signal indicates that a non-common memory block A is to be bypassed, the BIST bypass circuit 27 bypasses the BIST controller A 29 so that the corresponding memories will not be tested for faults; otherwise, the BIST bypass circuit 27 does not cause the BIST controller A 29 to be bypassed.

In addition, to avoid unnecessary power consumption by the bypassed scan chains, the test clock gating circuit 30 gates the scan clocks for the bypassed scan chains and BIST clocks for the bypassed BIST controllers in response to the bypass signals. That is, the scan clocks for the scan chains to be bypassed and the BIST clocks for the BIST controllers to be bypassed are disabled so that the latches and gates in the bypassed IP blocks are not toggled.

Figure 3:
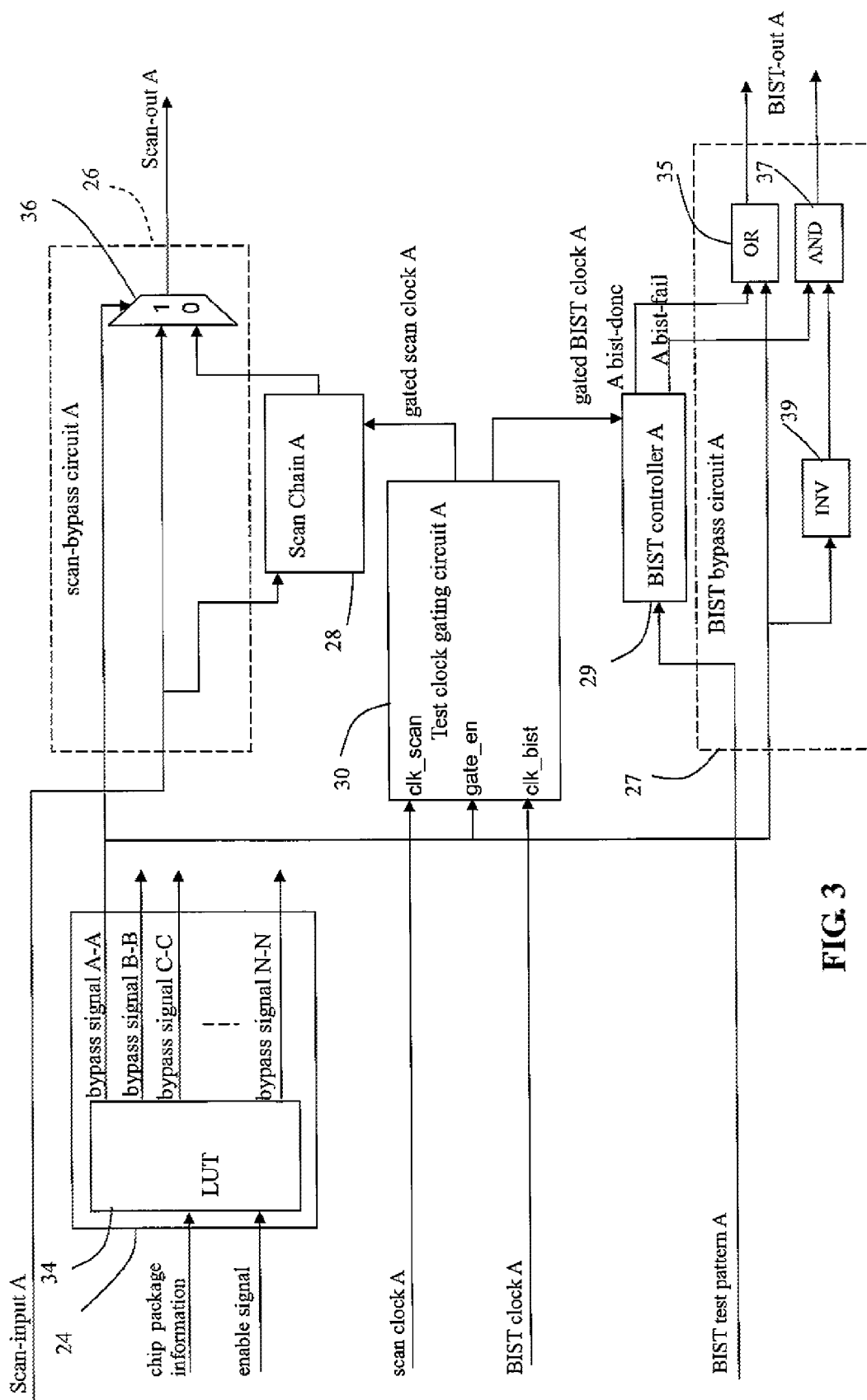
FIG. 3 is a schematic block diagram illustrating a bypass-signal generator, a scan-bypass circuit, a BIST-bypass circuit, and a test clock gating circuit of a system for scan and BIST testing of an integrated circuit according to an embodiment of the present invention.

FIG. 3 is a schematic diagram showing a logic structure of the bypass-signal generator 24, an exemplary scan-bypass circuit 26, an exemplary BIST bypass circuit 27, and an exemplary test clock gating circuit 30 in accordance with an embodiment of the present invention. The same or similar logic structures can be applied to other scan-bypass circuits 26, other BIST-bypassed circuits 27, and other test clock gating circuits 30 for scan chains and/or BIST controllers associated with non-common IP blocks in the IC 22.

Referring now to FIG. 3, in one embodiment of the present invention, the bypass-signal generator 24 includes a lookup table (LUT) 34. The LUT 34, in response to received chip package information and a bypass-enable signal, generates a plurality of bypass signals (A-A, B-B, C-C . . . N-N) for the plurality of scan chains associated with the non-common functional circuit blocks and the plurality of BIST controllers associated with the non-common memory blocks. For example, if the system 20 sets the bypass-enable signal to a true state, the bypass-signal generator 24 generates a bypass signal A-A for IP block A, a bypass signal B-B for IP block B, and so on, based on the chip package type information. Each bypass signal has a true or false state to indicate whether the associated scan chain and/or BIST controllers are to be bypassed. An embodiment of the true or false state of the lookup table (LUT) 34 is shown in FIG. 4 which will be described later in more details.

The plurality of bypass signals is input to a corresponding plurality of scan-bypass circuits 26 and to a corresponding plurality of BIST-bypass circuits 27. For the scan test, according to one embodiment of the present invention, each scan-bypass circuit 26 includes a multiplexer 36, e.g., a 2-to-1 multiplexer. A bypass signal is used as a selection signal of the multiplexer 36. For each non-common functional circuit block, the decompressed scan test pattern received from the decompressor 16 is provided to one input of the corresponding multiplexer 36 and to the scan input of its associated scan chain. The scan output of the scan chain is provided to another input of the multiplexer 36. Therefore, the scan-bypass circuit 26 can selectively output the scan-out test pattern in response to the bypass signal, which may be the decompressed scan input, that is, the scan chain is to be bypassed; or the scanned output of the scan chain, that is, the pattern is rippled through the scan chain and not bypassed.

According to one embodiment of the present invention, for the selected chip package, if the package information indicates that a non-common IP block is not used, the bypass signal associated with the non-common functional circuit block is true. Taking the non-common IP block A shown in FIG. 3 for example, its associated bypass signal A-A is provided to the 2-to-1 multiplexer 36 to serve as a selection signal. The corresponding decompressed scan-input A is provided to a first input of the 2-to-1 multiplexer 36 and to the scan input of the scan chain A 28. The scan-out A output from the scan chain A 28 is provided to a second input of the 2-to-1 multiplexer 36. When the bypass signal A-A is true, the scan-bypass circuit 26 outputs the decompressed scan-input A. That is, the system 20 bypasses the scan chain A 28. When the bypass signal A-A is false, the scan-bypass circuit 26 outputs the scanned test pattern A of the scan chain A 28. That is, the system 20 scans the scan chain A, rather than bypassing it.

In another embodiment of the present invention, for a BIST, bypassing the BIST controller is performed by a pair of OR gate 35 and AND gate 37 through an inverter 39, wherein the bypass signal is coupled to the respective input of the pair of OR gate and AND gate as a selection signal. Each of the plurality of memory BIST controller A 29 has two outputs of "A BIST-done" and "A BIST-fail". Asserting "A BIST-done" to a logic high (or true) state and "A BIST-fail" to a logic low (or false) state by the BIST controller A 29 indicates the corresponding memory module is in a good condition. When the bypass signal A-A is true, the output of the inverter 39 is false, and the pair of OR gate and AND gate outputs the same values on "BIST-out A" bypassing the BIST controller A 29. That is the BIST controller is in don't-care condition regardless whether the memory has problem or not.

In an embodiment of the present invention, the plurality of bypass signals is input to the test clock gating circuits 30 to shut down the scan clocks of those bypassed scan chains and/or the BIST clocks of those bypassed BIST controllers. According to one embodiment of the present invention, each test clock gating circuit 30 includes a NAND gate or an integrated clock gating cell (not shown). The test clock gating circuit 30 receives a scan clock signal, a BIST clock signal and an associated bypass signal from the bypass-signal generator 24, which is used as a gated enable signal. The outputs of the test clock gating circuit are the gated/or ungated scan clocks and/or BIST clocks in response to the bypass signal.

Taking the non-common IP block A shown in FIG. 3 for example, the bypass signal A-A is provided to the test clock gating circuit 30 to serve as an gating enable signal. When the bypass signal A-A is true, the scan clock and BIST clock from test clock gating circuit 30 will be gated. The test clock gating circuit A 30 outputs gated scan clock A for scan chain A and gated BIST clock A for BIST controller A. When the bypass signal A-A is false, the scan clock and BIST clock from the test clock gating circuit 30 will not be gated. The test clock gating circuit A 30 outputs ungated scan clock A for scan chain A and ungated BIST clock A for BIST controller A.

FIG. 4 is a truth table illustrating a logic decoding table 40 to determine values of bypass signals in response to package information according to an embodiment of the present invention. As shown in FIG. 4, each bypass signal has a true (a high logic state or "1") or false (a low logic state or "0") state to indicate whether the associated scan chain and/or BIST controller is to be bypassed. In one embodiment, the package information can be encoded by four digits of binary numbers with each digit having two logic states—true or false. In one particular package requirement where all IP blocks are used, the package information is encoded with all false or zero (0000), as indicated in the decoding table 40, indicating none of the IP blocks will be bypassed. In another particular package requirement where IP block C-C are not used, the package information is encoded with 0001 indicating the decoding logic will set the bypass signal C-C to true and other bypass signals remain at zeros, that is, the scan chain C and/or BIST controller C is to be bypassed. In yet another particular package requirement where all the non-common IP blocks are not used, the package information is encoded with all true or ones (1111), as shown in the last row of the decoding table 40, indicating all the non-common circuit IP blocks will be bypassed. In other package requirements where a certain number of the non-common circuit IP blocks are not used, a decoding logic can be constructed to generate a true (or "1") state in the corresponding outputs of the bypass signal locations.

Figure 5:
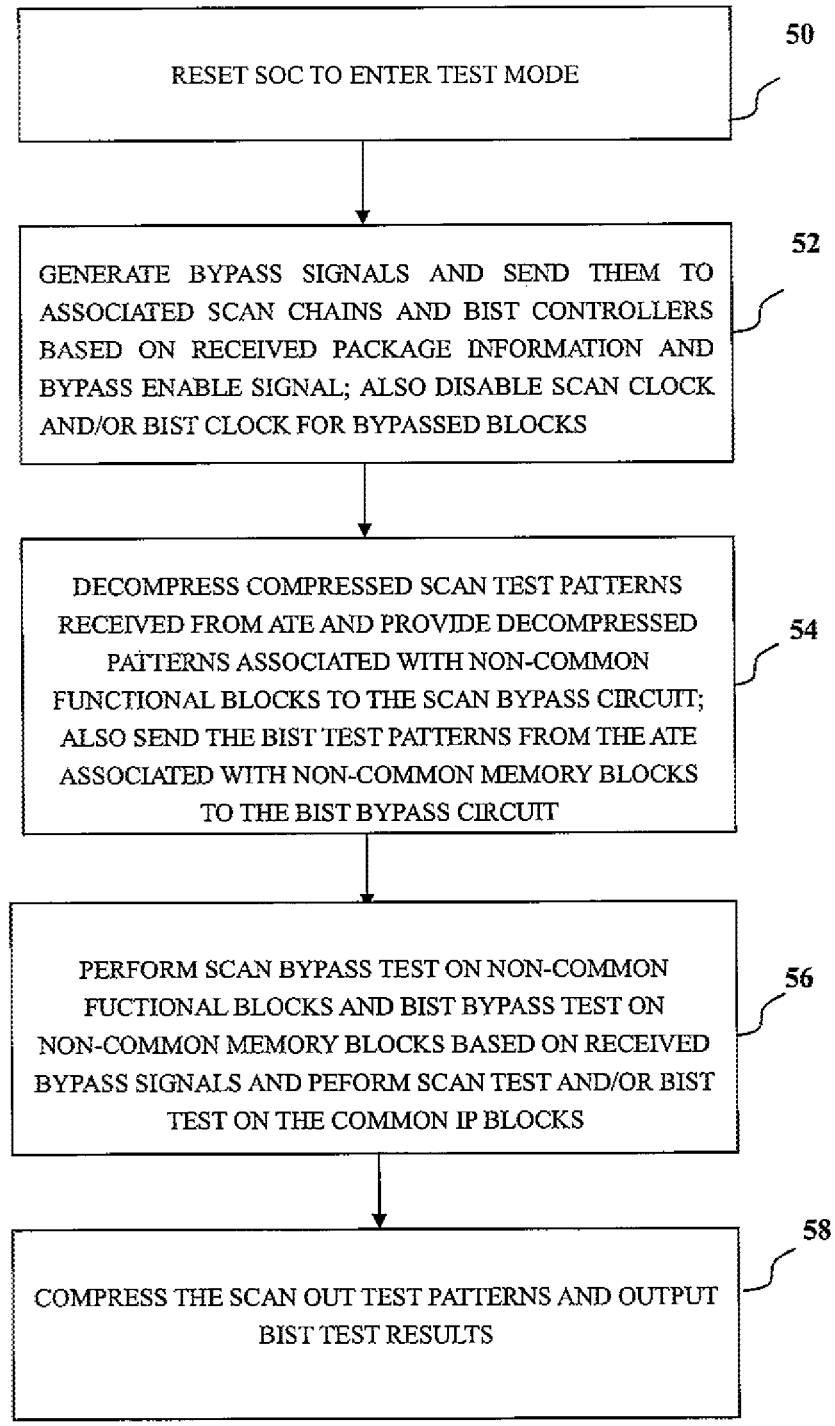
FIG. 5 is a flow chart illustrating a method for performing scan and BIST testing on integrated circuits in accordance with an embodiment of the present invention.

FIG. 5 is a flow chart illustrating a method for performing a scan test and/or a memory BIST in accordance with an embodiment of the present invention. Though the flow chart is explained below in conjunction with FIGS. 2, 3 and 4, the method for performing the scan test and/or a memory BIST may be implemented by computer software in other embodiments. Furthermore, the sequence of steps is not limited by the number of the steps. Accordingly, the flow chart is only used to clearly illustrate and describe the embodiments of the present invention, but does not limit the essence of the present invention.

Referring to FIG. 5, at step 50, the IC or SoC 22 with multiple package options is reset so as to enter a test mode. Note, as previously discussed, each package option may be a multi-chip package or a single-chip package. The common IP blocks of the IC 22 are scanned and BIST tested in a current test mode, however, the non-common IP blocks are scanned using a scan bypass test and/or a BIST bypass test as follows.

At step 52, a plurality of bypass signals are generated by the bypass-signal generator 24 (e.g., using the LUT 34), and each bypass signal is sent to an associated one of the plurality of scan chains and/or the plurality of BIST controllers based on received chip package information and the bypass-enable signal. That is, for a first scan chain and/or BIST controller, e.g. scan chain A and BIST controller A associated with a first non-common IP block, e.g., IP block A, a first bypass signal, e.g., bypass signal A-A is generated, for a second scan chain and/or BIST controller, e.g., scan chain B and BIST controller B associated with a second non-common IP block, e.g., IP block B, a second bypass signal e.g., bypass signal B-B is produced, and so on. For the selected chip package type, if the package information indicates a non-common IP block is not used, the bypass signal for the non-common IP block is set at a first state, for example, true; otherwise, the bypass signal is set at a second state, false.

Continuing with step 52, in an embodiment of the present invention, the method further includes providing the plurality of bypass signals from the bypass-signal generator 24 as input to the plurality of scan-clock and BIST-clock gating circuits 30 to shut down the scan clocks and BIST clocks for those scan chains and BIST controllers that are bypassed. For example, the first bypass signal A-A is provided to the first scan-clock gating circuit A 30 to act as an gating enable signal. When the bypass signal A-A is true, the scan clock of the non-common IP block A is gated in test clock gating circuit 30. When the bypass signal A-A is false, the scan clock pass through the test clock gating circuit 30, i.e. the scan clock of the non-common IP block A is not gated. The operation to shut down the BIST clocks of the unused non-common BIST controllers is essentially the same as that shutting down the scan clocks.

At step 54, compressed scan test patterns from the ATE 14 are decompressed by the decompressor 16, and the decompressed scan test patterns associated with the non-common functional circuit blocks are output to the scan-bypass circuit 26, while those associated with the common functional circuit blocks are output to their respective scan chains 32 (e.g., chain 0 and chain 1). In addition, the BIST test patterns from the ATE 14 associated with non-common memory blocks are directly sent to the BIST-bypass circuit 26 for BIST bypass test, while those associated with the common memory blocks are output to their respective BIST controllers.

At step 56, the scan-bypass test is performed by the plurality of scan-bypass circuits 26 and BIST bypass test of the non-common IP blocks is performed by the plurality of BIST-bypass circuit 27 based on the received bypass signals. Specifically, each bypass signal is used as a selection signal of the associated scan-bypass circuit 26 and BIST-bypass circuit 27 of one non-common IP block. For example, the first bypass signal is provided to a first scan-bypass circuit 26 (e.g., a 2-to-1 multiplexer 36) to serve as a selection signal, the second bypass signal is provided to a second scan-bypass circuit 26 to serve as a selection signal for another 2-1 multiplexer 36, and so on. Regarding the scan chain A 28 in FIG. 3, when the bypass signal A-A is true, the decompressed scan test pattern A is output by the scan-bypass circuit A 26, that is, the scan chain A is to be bypassed. When the bypass signal A-A is false, the scan output of the scan chain A 28 is output by the scan-bypass circuit A 26. That is, the scan chain A is scanned, rather than bypassed. For BIST bypass test, when the bypass signal A-A is true, the BIST-done signal output from BIST bypass circuit 27 will be always high and the BIST-fail output will be always zero. That is, the BIST controller A will be bypassed or not checked. When the bypass signal A-A is false, BIST controller A will be tested as normal, rather than bypassed.

At step 58, the compressor 18 compresses all of the scan-out test patterns shifted from the common functional circuit blocks and non-common functional circuit blocks and then outputs the compressed scan-out test patterns to the ATE 14. Similarly, the BIST controllers 29, 33 will output BIST test results patterns to the ATE 14. In other embodiments, the BIST test patterns and test responses can be decompressed/compressed in a way similar to the scan test patterns.

By using the package information to automatically bypass the scan chains and/or the BIST controllers for the non-common IP blocks that are not used in a certain package, the present invention can achieve a yield recovery. In addition, the present invention uses the package information to automatically gate the scan clocks and BIST clocks of the unused IP blocks and reduces power dissipation during the scan test.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the present invention, as described in the claims.

The invention claimed is:

1. A system for performing a scan test and memory built-in self test (BIST) on an integrated circuit (IC), the system comprising:
   a bypass-signal generator that generates a first bypass signal based on a chip package information, the first bypass signal indicating whether a first scan chain associated with a first non-common functional circuit block of the IC is to be bypassed; and
   a first scan-bypass circuit, connected to the bypass-signal generator and receiving the first bypass signal, for bypassing the first scan chain in response to the first bypass signal;
   a first built-in self test (BIST) controller associated with a first non-common memory block of the IC; and
   a first BIST-bypass circuit, connected to the bypass-signal generator and receiving the first bypass signal, for gating off an output of the first BIST controller in response to the first bypass signal.

2. The system of claim 1, wherein the integrated circuit includes an input pin for receiving an enable signal that is provided to the bypass signal generator to initiate scan-bypass and BIST controller gating off testing.

3. The system of claim 1, further comprising:
   a first test clock gating circuit for gating a scan clock for the first scan chain in response to the first bypass signal.

4. The system of claim 3, wherein the first test clock gating circuit further gates a BIST clock for the first BIST controller in response to the first bypass signal.

5. The system of claim 1, wherein the first scan-bypass circuit includes a first multiplexer, and wherein the first bypass signal is provided to the first multiplexer as a selection signal.

6. The system of claim 1, wherein the bypass-signal generator generates a second bypass signal based on the chip package information, and wherein the bypass-signal generator includes a lookup table for generating the first and second bypass signals.

7. The system of claim 6, wherein the lookup table further comprises a logic decoding table for determining values of the first and second bypass signals based on the chip package information.

8. A system for performing a memory built-in self test (BIST) on an integrated circuit (IC), wherein the IC includes first and second non-common memory blocks, the system comprising:
    first and second BIST controllers associated with the first and second non-common memory blocks;
    a bypass-signal generator that generates a first and second bypass signals based on a chip package information, the first and second bypass signals indicating whether the first and second BIST controllers associated with the first and second non-common memory blocks of the IC are to be assigned with a don't-care condition regardless of whether one of the first and second non-common memory blocks has a problem; and
    first and second BIST-bypass circuits, connected to the bypass-signal generator and receiving the first and second bypass signals, for gating the outputs of the first and second BIST controllers in response to the first and second bypass signals.

9. The system of claim 8, further comprising:
    a first test clock gating circuit for gating a BIST clock for one of the first and second BIST controllers in response to one of the first and second bypass signals.

10. The system of claim 8, wherein the first BIST-bypass circuit includes a first pair of an OR gate and an AND gate coupled to an inverter, and wherein the first bypass signal is provided to the first pair of the OR gate and the AND gate to gate the output of the first BIST controller.

11. The system of claim 8, wherein the bypass-signal generator includes a lookup table for generating the first and second bypass signals.

12. The system of claim 11, wherein the lookup table further comprises a logic decoding table for determining values of the first and second bypass signals based on the chip package information.

13. A system for performing a scan test and memory built-in self test (BIST) on an integrated circuit (IC), the system comprising:
    a bypass-signal generator that generates a first bypass signal based on a chip package information, the first bypass signal indicating whether a first scan chain associated with a first non-common functional circuit block of the IC is to be bypassed, and whether a first BIST controller associated with a first non-common memory block of the IC is to be assigned with a don't-care condition;
    a first scan-bypass circuit, connected to the bypass-signal generator and receiving the first bypass signal, for bypassing the first scan chain in response to the first bypass signal; and
    a first BIST-bypass circuit, connected to the bypass-signal generator and receiving the first bypass signal, for gating an output of the first BIST controller in response to the first bypass signal.

14. The system of claim 13, further comprising:
    a first test clock gating circuit, connected to the bypass-signal generator and receiving the first bypass signal, for gating a scan clock for the first scan chain and a BIST clock for the first BIST controller in response to the first bypass signal.

15. The system of claim 13, wherein the first scan-bypass circuit includes a first multiplexer, and wherein the first bypass signal is provided to the first multiplexer as a selection signal.

16. A method for performing a memory built-in self test (BIST) on an integrated circuit (IC), the method comprising:
    generating a first bypass signal based on a chip package information, the first bypass signal indicating whether a first BIST controller associated with a first non-common memory block of the IC is to be assigned with a don't care condition regardless of whether there is a problem in the first non-common memory block; and
    gating an output of the first BIST controller in response to the first bypass signal.

17. The method of claim 16, further comprising:
    gating a BIST clock for the first BIST controller in response to the first bypass signal.

* * * * *